United States Patent
Shiu et al.

(10) Patent No.: US 7,993,956 B2
(45) Date of Patent: Aug. 9, 2011

(54) POLY DIODE STRUCTURE FOR PHOTO DIODE

(76) Inventors: Yu-Da Shiu, Hsinchu (TW); Chyh-Yih Chang, Hsinchu (TW); Ming-Dou Ker, Hsinchu (TW); Che-Hao Chuang, Hsinchu (TW)

(*) Notice: Subject to any disclaimer, the term of this patent is extended or adjusted under 35 U.S.C. 154(b) by 1063 days.

(21) Appl. No.: 11/618,685

(22) Filed: Dec. 29, 2006

(65) Prior Publication Data

US 2007/0138589 A1      Jun. 21, 2007

Related U.S. Application Data

(60) Division of application No. 11/017,053, filed on Dec. 21, 2004, now Pat. No. 7,205,641, which is a continuation-in-part of application No. 10/702,437, filed on Nov. 7, 2003, now abandoned.

(51) Int. Cl.
*H01L 21/00* (2006.01)

(52) U.S. Cl. .......... 438/97; 257/458; 257/E29.336; 257/E31.061

(58) Field of Classification Search ............. 257/458, 257/E31.061, E29.336; 438/97
See application file for complete search history.

(56) References Cited

U.S. PATENT DOCUMENTS

| | | |
|---|---|---|
| 4,939,616 A | 7/1990 | Rountree |
| 5,012,317 A | 4/1991 | Rountre |
| 5,225,359 A | 7/1993 | DeLong |
| 5,225,702 A | 7/1993 | Chatterjee |
| 5,248,623 A | 9/1993 | Muto et al. |
| 5,453,384 A | 9/1995 | Chatterjee |
| 5,465,189 A | 11/1995 | Polgreen et al. |
| 5,502,328 A | 3/1996 | Chen et al. |
| 5,519,242 A | 5/1996 | Avery |
| 5,581,104 A | 12/1996 | Lowrey et al. |
| 5,629,544 A | 5/1997 | Voldman et al. |
| 5,631,793 A | 5/1997 | Ker et al. |
| 5,633,523 A * | 5/1997 | Kato .................. 257/369 |
| 5,646,808 A | 7/1997 | Nakayama |
| 5,654,862 A | 8/1997 | Worley et al. |
| 5,719,737 A | 2/1998 | Maloney |
| 5,754,381 A | 5/1998 | Ker |
| 5,807,791 A | 9/1998 | Bertin et al. |
| 5,811,857 A | 9/1998 | Assaderaghi et al. |
| 5,907,462 A | 5/1999 | Chatterjee et al. |
| 5,910,874 A | 6/1999 | Iniewski et al. |
| 5,923,067 A | 7/1999 | Voldman |
| 5,932,918 A | 8/1999 | Krakauer |
| 5,940,258 A | 8/1999 | Duvvury |
| 5,990,520 A | 11/1999 | Noorlag et al. |

(Continued)

OTHER PUBLICATIONS

Wolf, S. and Tauber, R.N.; Silicon Processing for the VLSI Era—vol. 1: Process Technology; 2000; Lattice Press; Second Edition; pp. 829-834.*

(Continued)

*Primary Examiner* — Matthew C Landau
*Assistant Examiner* — Vicki B Booker

(57) ABSTRACT

An integrated circuit device for converting an incident optical signal into an electrical signal comprises a semiconductor substrate, a well region formed inside the semiconductor substrate, a dielectric layer formed over the well region, and a layer of polysilicon for receiving the incident optical signal, formed over the dielectric layer, including a p-type portion, an n-type portion and an undoped portion disposed between the p-type and n-type portions, wherein the well region is biased to control the layer of polysilicon for providing the electrical signal.

9 Claims, 19 Drawing Sheets

U.S. PATENT DOCUMENTS

| | | | |
|---|---|---|---|
| 6,015,992 | A | 1/2000 | Chatterjee et al. |
| 6,034,397 | A | 3/2000 | Voldman |
| 6,081,002 | A | 6/2000 | Amerasekera et al. |
| 6,218,895 | B1 | 4/2001 | De et al. |
| 6,232,163 | B1 | 5/2001 | Voldman et al. |
| 6,690,065 | B2 * | 2/2004 | Chang et al. ............ 257/355 |
| 6,936,895 | B2 * | 8/2005 | Manna et al. ............ 257/355 |
| 7,205,641 | B2 | 4/2007 | Shiu et al. |
| 7,439,597 | B2 | 10/2008 | Shiu et al. |
| 2005/0077577 | A1 | 4/2005 | Manna et al. |

OTHER PUBLICATIONS

M-D. Ker, et al., "CMOS On-Chip ESD Protection Design with Substrate-triggering Technique," Proc. of ICECS, vol. 1, pp. 273-276, 1998.

C. Duvvury et al., "Dynamic Gate Coupling for NMOS for Efficient Output ESD Protection", Proc. of IRPS, pp. 141-150, 1992.

N. K. Verghese and D. Allstot, "Verification of RF and Mixed-Signed Integrated Circuits for Substrate Coupling Effects", in Proc. of IEEE Custom Integrated Circuits Conf., 1997, pp. 363-370.

M.Xu, D. Su, D. Shaeffer, T.Lee, and B. Wooley, Measuring and Modeling the Effects of Substrate Noise on LNA for a CMOS GPS Receiver, IEEE Journal of Solid-State Circuits, vol. 36, pp. 473-485, 2001.

R. Gharpurey, "A Methodology for Measurement and Characterization of Substrate Noise in High Frequency Circuits," in Proc. of IEEE Custom Integrated Circuits Conf., 1999, pp. 487-490.

M. Nagata, J. Nagai, K. Hijikata, T. Morie, and A. Iwata, PhysicalDesign Guides for Substate Noise Reduction in CMOS Digital Circuits, IEEE Journal of Solid-State Circuits, vol. 36, pp. 539-549, 2001.

M.-D. Ker, T-Y, Chen, C-Y. Wu, and H.-H. Chang, ESD Protection Design on Analog Pin With Very Low Input Capacitance for High-Frequency or Current-Mode Applications, IEEE Journal of Solid-State Circuits, vol. 35, pp. 1194-1199, 2000.

M.-D. Ker, Whole-Chip ESD Protection Design with Efficient VDD-to-VSS ESD Clamp Circuit for Submicron CMOS VLSI, IEEE Trans. on Electron Devices, vol. 46, pp. 173-183, 1999.

C. Richier, P. Salome, G. Mabboux, I. Zaza, A. Juge, and P. Mortini, Investigation on Different ESD Protection Strategies Devoted to 3.3V RF Applications (2 (GHz) in a 0.18 .mu.m CMOS Process, in Proc. of EOS/ESD Symp., 200, pp. 251-259.

T.-Y. Chen and M.-D. Ker, "Design on ESD Protection Circuit With Low and Constant Input Capacitance," in Proc. of IEEE Int. Symp. on Quality Electronic Design, 2001, pp. 247-247.

M.-D. Ker, T.-Y. Chen C. Yo Wu, and H.-H. Chang, ESD Protection Design on Analog Pin With Very Low Input Capacitance for RF or Current-Mode Applications, IEEE Journal of Solid-State Circuits, vol. 35, pp. 1194-1199, 2000.

S.Voldman, et al. , "Semiconductor Process and Structural Optimization of Shallow Trench Isolation-Defined and Polysilicon-Bound Source/Drain Diodes for ESD Networks," in Proc. of EOS/ESD Symp., 1998, pp. 151-160.

M.J. Pelgrom, et al., "A 3/5 V Compatible I/O Buffer," IEEE Journal of Solid-State Circuits, vol. 30, No. 7, pp. 823-825, Jul. 1995.

G.P. Singh, et al., "High-Voltage-Tolerant I/OBuffers with Low-Voltage CMOS Process," IEEE Journal of Solid-State Circuits, vol. 34, No. 11, pp. 1512-1525, Nov. 1999.

H. Sanchez, et al., A Versatile 3.3/2.5/1.8-V CMOS I/O Driver Built in 02.-.mu.m, 3.5-nm Tox, 1.8-V CMOS Technology, IEEE Journal of Solid-State Circuits, vol. 34 No. 11.pp. 1501-1511, Nov. 1999.

S. Voldman, et al., "Analysis of Snubber-Clamped Diode-String Mixed Voltage Interface ESD Protection Network for Advanced Microprocessors," in Proc. of EOS/ESD symposium, 1995, pp. 43-61.

* cited by examiner

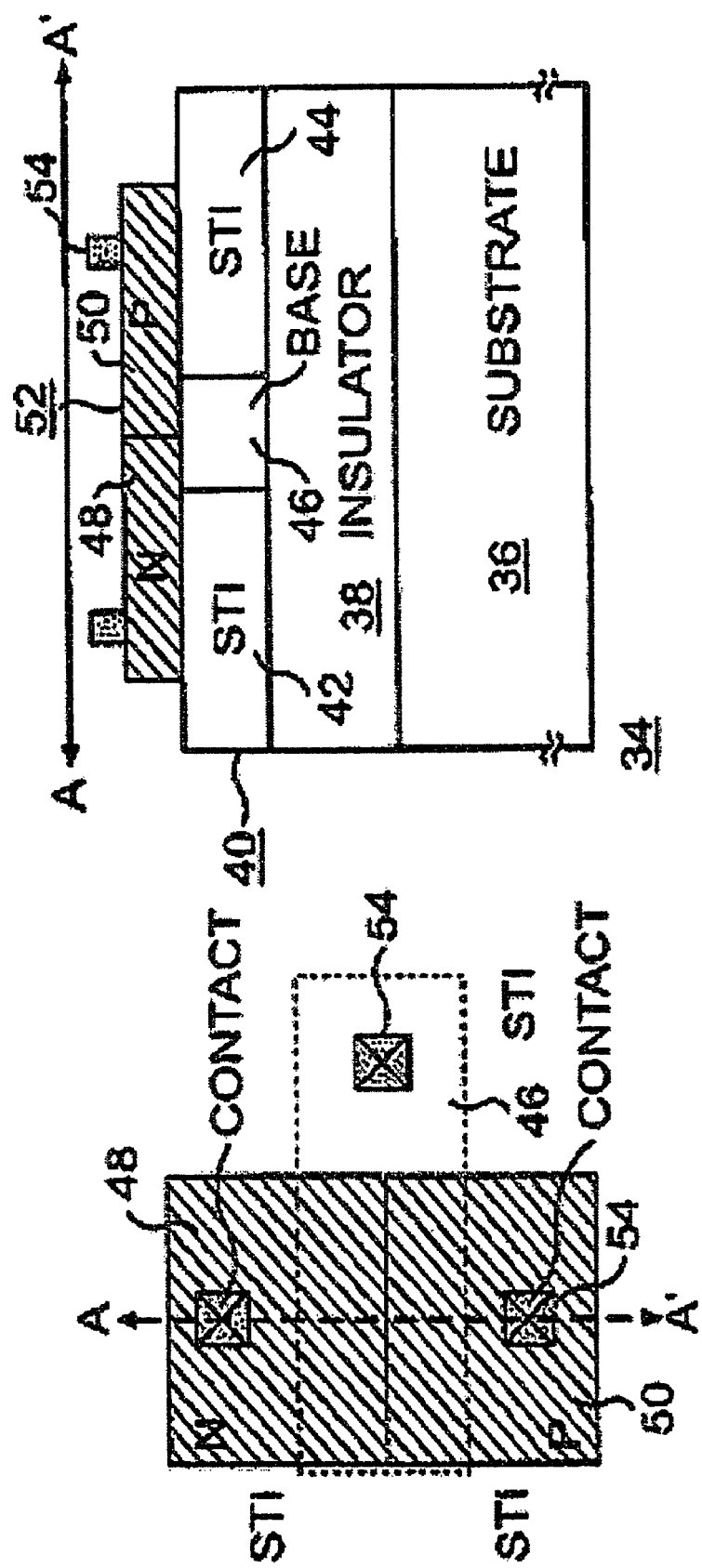

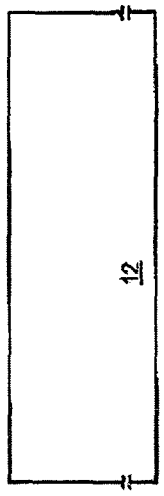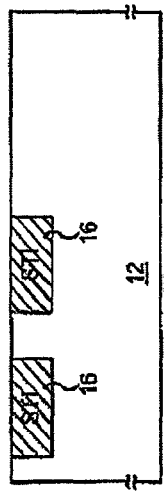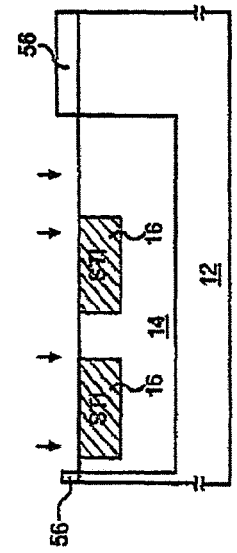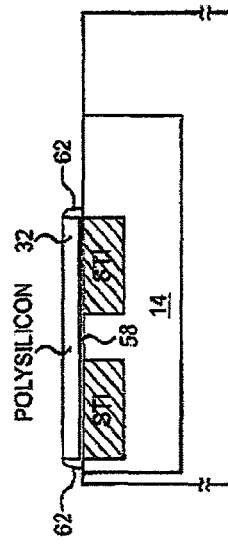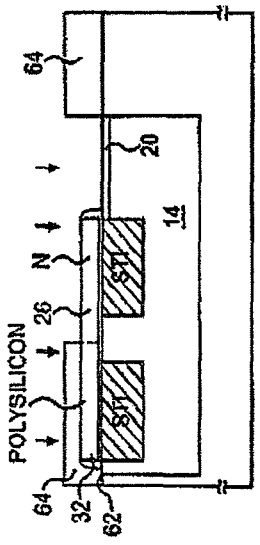

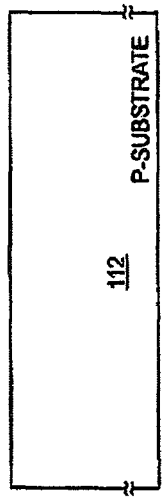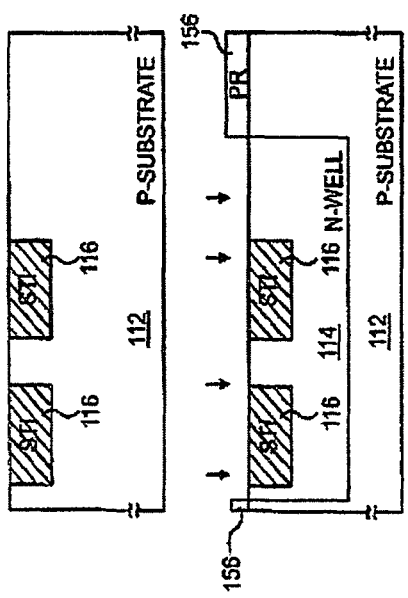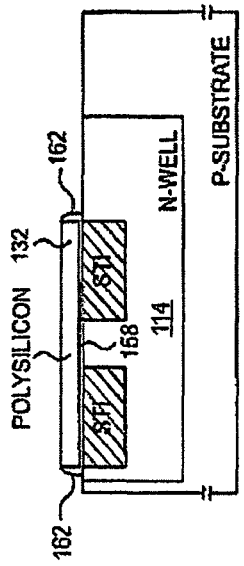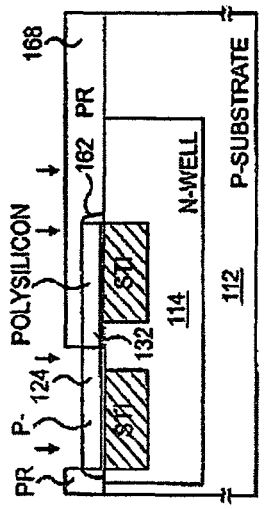
FIG. 9A  FIG. 9B  FIG. 9C  FIG. 9D  FIG. 9E

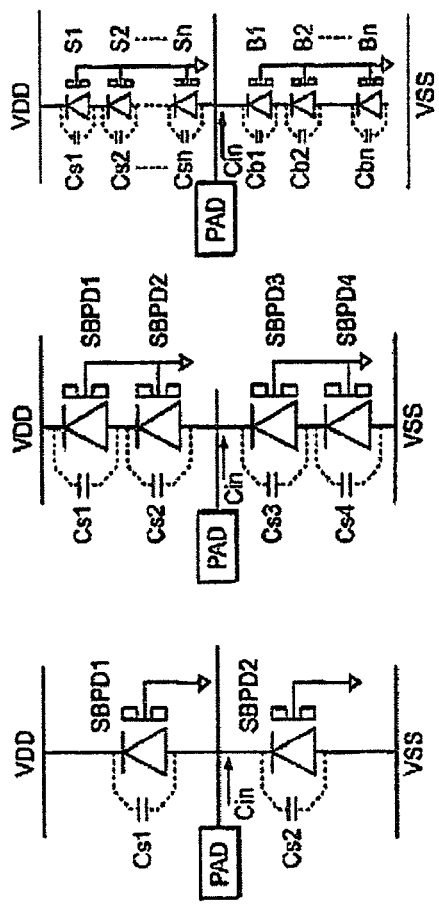
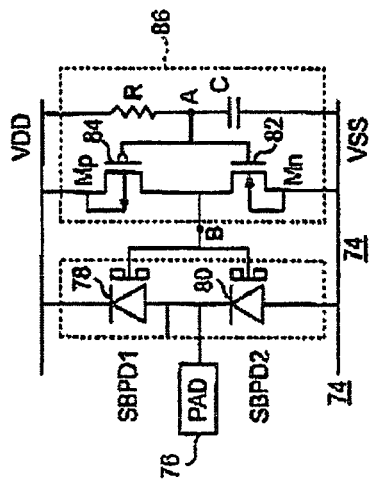
FIG. 13A  FIG. 13B  FIG. 13C
FIG. 14

POLY DIODE STRUCTURE FOR PHOTO DIODE

CROSS-REFERENCE TO RELATED APPLICATIONS

The present application is a divisional of U.S. application Ser. No. 11/017,053 filed Dec. 21, 2004 now U.S. Pat. No. 7,205,641, which in turn is a continuation-in-part of U.S. application Ser. No. 10/702,437 filed Nov. 7, 2003, now abandoned.

BACKGROUND

1. Field of the Invention

This invention pertains in general to a semiconductor device, and, more particularly, to a substrate-biased silicon diode and a method for making the same.

2. Background of the Invention

A semiconductor integrated circuit (IC) is generally susceptible to an electrostatic discharge (ESD) event, which may damage or destroy the IC. An ESD event refers to a phenomenon of electrical discharge of a current (positive or negative) for a short duration in which a large amount of current is provided to the IC. The high current may be built-up from a variety of sources, such as the human body. Many schemes have been implemented to protect an IC from an ESD event. A common protection scheme is using a parasitic transistor associated with an n-type metal-oxide semiconductor (MOS) with the source coupled to ground and the drain connected to the pin to be protected from an ESD event.

Diodes or diode-coupled transistors have been used for ESD protection in radio-frequency (RF) applications. In a RF IC, an on-chip ESD circuit should ideally provide robust ESD protection, while exhibiting minimum parasitic input capacitance and low voltage-dependency. In deep-submicron complementary metal-oxide semiconductor (CMOS) process technology with shallow-trench isolations (STIs), a diode has been used for ESD protection and is generally formed contiguous with either an $N^+$ or $P^+$ diffusion region in a semiconductor substrate. FIG. 1A shows a cross-sectional view of a known diode ESD protection structure formed in an IC. Referring to FIG. 1A, a $P^+$ diffusion region is bound by STIs on either side, and therefore the diode formed by the STI is also known as an STI-bound diode. The STI-bound diode exhibits a bottom capacitance, $C_{bottom}$. However, an STI-bound diode has been found to have significant leakage current due to an interference between a silicide layer (not shown) of the $P^+$ diffusion region and the STIs around the $P^+$ region.

FIG. 1B shows a cross-sectional view of another known diode ESD protection structure, known as a polysilicon-bound diode, introduced to address the leakage current problem with an STI-bound diode. The $P^+$ diffusion region in a polysilicon-bound diode is now defined by a polysilicon gate, and therefore the leakage current from the edges of STIs is eliminated. However, the total parasitic capacitance of the polysilicon-bound diode is larger than that of the STI-bound diode because of the addition of the sidewall junction capacitance of the $P^+$ diffusion region.

FIG. 2 is a circuit diagram showing a known ESD protection scheme using dual diodes. Referring to FIG. 2, the combination of the dual-diode structures and $V_{DD}$-to-$V_{SS}$ ESD clamp circuit provides a path for an ESD current 2 to discharge, instead of through the internal circuits. When ESD current 2 is provided to a signal pad PAD1, and with a signal pad PAD2 relatively grounded, ESD current 2 is conducted to $V_{DD}$ through Dp1. ESD current 2 is discharged to $V_{SS}$ through the $V_{DD}$-to-$V_{SS}$ ESD clamp circuit and flows out of the IC from Dn2 to PAD2. Diode Dp1 has a capacitance of Cp1 and diode Dn1 has a capacitance of Cn1. The total input capacitance $C_{in}$ of the circuit shown in FIG. 2 primarily comes from the parasitic junction capacitance of diodes, and is calculated as follows:

$$C_{in}=Cp1+Cn1$$

wherein Cp1 and Cn1 are parasitic junction capacitances of diodes Dp1 and Dn1, respectively.

FIG. 3 is plot showing the relationship between a pad voltage and parasitic input capacitance of the circuit shown in FIG. 2. Referring to FIG. 3, when the voltage on the pad increases, the parasitic junction capacitance of Dp1 increases and the parasitic junction capacitance of Dn1 decreases. Therefore, the total input parasitic capacitance $C_{in}$ is nearly constant. This characteristic is important in RF applications. However, the total parasitic capacitance of a polysilicon-bound diode, as compared to an STI-bound diode, is increased because of the addition of a sidewall capacitance, $C_{sidewall}$, as shown in FIG. 1B.

BRIEF SUMMARY OF THE INVENTION

The present invention is directed to a device and a method that obviate one or more problems resulting from the limitations and disadvantages of the prior art.

In accordance with an embodiment of the present invention, there is provided an integrated circuit device for converting an incident optical signal into an electrical signal that comprises a semiconductor substrate, a well region formed inside the semiconductor substrate, a dielectric layer formed over the well region, and a layer of polysilicon for receiving the incident optical signal, formed over the dielectric layer, including a p-type portion, an n-type portion and an intrinsic portion disposed between the p-type and n-type portions, wherein the well region is biased to control the layer of polysilicon for providing the electrical signal.

Also in accordance with the present invention, there is provided an integrated circuit device for converting an incident optical signal into an electrical signal that comprises a semiconductor substrate, a well region formed inside the semiconductor substrate, a dielectric layer formed over the well region, and a layer of polysilicon for receiving the incident optical signal, formed over the dielectric layer, including a first portion of a first dopant type, a second portion of a second dopant type different from the first dopant type, and an intrinsic portion surrounding the first portion and being surrounded by the second portion, wherein the well region is biased to control the layer of polysilicon for providing the electrical signal.

Further in accordance with the present invention, there is provided an integrated circuit device for converting an incident optical signal into an electrical signal that comprises a semiconductor substrate, a well region formed inside the semiconductor substrate, a dielectric layer formed over the well region, a layer of polysilicon for receiving the incident optical signal, formed over the dielectric layer, including a first portion of a first dopant type, a second portion of a second dopant type different from the first dopant type, and an intrinsic portion formed contiguous with the first and second portions, a first depletion region formed at an interface between the first portion and the intrinsic portion, and a second depletion region formed at an interface between the intrinsic portion and the second portion, wherein the well region is biased to control the width of first or second depletion region for providing the electrical signal.

Still in accordance with the present invention, there is provided an image sensor integrated circuit device that comprises an array of connection lines arranged in rows and columns, an array of photocells for converting an incident optical signal into an electrical signal, each of the array of photocells, disposed near an intersection of one of the row connection lines and one of the column connection lines, including a semiconductor substrate, a well region formed inside the semiconductor substrate, a dielectric layer formed over the well region, a layer of polysilicon for receiving the incident optical signal, formed over the dielectric layer, including a first portion of a first dopant type, a second portion of a second dopant type different from the first dopant type, and an intrinsic portion formed contiguous with the first and second portions, a row decoder coupled to the array of photocells for generating a row select signal for a row of the array of photocells, and a column decoder coupled to the array of photocells for decoding a column of the array of photocells, wherein the well region is biased to control the layer of polysilicon for providing the electrical signal.

Yet still in accordance with the present invention, there is provided a method for converting an optical signal into an electrical signal through a complementary metal-oxide-semiconductor device that comprises preparing a semiconductor substrate, forming a well region inside the semiconductor substrate, forming a dielectric layer over the well region, forming a layer of polysilicon over the dielectric layer, the layer of polysilicon including a p-type portion, an n-type portion and an intrinsic portion disposed between the p-type and n-type portions, radiating the optical signal onto the layer of polysilicon, and biasing the well region to control the layer of polysilicon for providing the electrical signal.

Further still in accordance with the present invention, there is provided a method for converting an optical signal into an electrical signal through a complementary metal-oxide-semiconductor device that comprises preparing a semiconductor substrate, forming a well region inside the semiconductor substrate, forming a dielectric layer over the well region, forming a layer of polysilicon over the dielectric layer, the layer of polysilicon including a first portion of a first dopant type, a second portion of a second dopant type different from the first dopant type, and an intrinsic portion surrounding the first portion and being surrounded by the second portion, radiating the optical signal onto the layer of polysilicon, and biasing the well region to control the layer of polysilicon for providing the electrical signal.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the present invention and together with the description, serves to explain the principles of the invention.

BRIEF DESCRIPTION OF THE DRAWINGS

Reference will now be made in detail to the present embodiment of the invention, an example of which is illustrated in the accompanying drawings. Wherever possible, the same reference numbers are used throughout the drawings to refer to the same or like parts.

FIG. 6 shows a cross-sectional view of a base-biased silicon diode in accordance with one embodiment of the present invention;

FIG. 7 is a layout diagram of the base-biased silicon diode of FIG. 5;

FIGS. 8A-8H are cross-sectional views of the steps in a method of forming a substrate-biased silicon diode with an n-type center region;

FIGS. 9A-9H are cross-sectional views of the steps in a method of forming a substrate-biased silicon diode with a p-type center region;

FIG. 13A is a circuit diagram of one embodiment of an ESD protection circuit using substrate-biased silicon diodes of the present invention;

FIG. 13B is a circuit diagram of one embodiment of an ESD protection circuit using stacked substrate-biased silicon diodes of the present invention;

FIG. 13C is a circuit diagram of another embodiment of an ESD protection circuit using stacked substrate-biased silicon diodes of the present invention;

FIG. 14 is a circuit diagram of one embodiment of an ESD protection circuit with biased dual substrate-biased silicon diodes of the present invention;

DETAILED DESCRIPTION OF THE INVENTION

In accordance with the present invention, there is provided a substrate-biased polysilicon diode (SBPD) for ESD protection. The SBPD of the present invention is biased from the substrate for an improved turn-on speed of the SBPD and reduced leakage current. Unlike conventional diodes, an SBPD does not have a bottom junction capacitance and therefore exhibits a relatively smaller junction capacitance. In addition, because an SBPD is disposed over shallow trench isolations (STIs) in a silicon substrate, the silicon area used by the SBPD is reduced, which reduces cost. The SBPD of the present invention additionally provides a substrate-biased function, and therefore provides more flexibility in RF IC applications.

Figure 4:
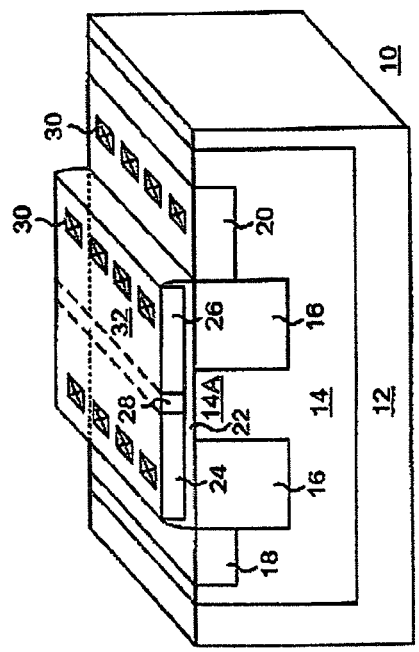
FIG. 4 shows a cross-sectional view of a silicon diode in accordance with one embodiment of the present invention.

FIG. 4 shows a cross-sectional view of an SBPD in accordance with one embodiment of the present invention. Referring to FIG. 4, an integrated circuit 10 includes a semiconductor substrate 12 and a well region 14 formed inside semiconductor substrate 12. Two isolation structures 16 are formed inside well region 14 and are spaced apart from one another. Isolation structures may be conventional STIs used for device isolation. Integrated circuit 10 also includes a diffused region 20 adjacent one of STIs 16. Diffused region 20 is doped with the same type of impurity as well region 14. Integrated circuit 10 may also include another diffused region 18 adjacent one of STIs 16. In one embodiment of the invention, semiconductor substrate 12 is a p-type substrate, well region 14 is an n-well, and diffused region 20 is an n-type diffused region. The optional diffused region 18 is a p-type diffused region.

A dielectric layer 22 is formed over the well region 14, overlapping STIs 16 and a portion of well region 14A disposed between STIs 16. Dielectric layer 22 may be an oxide layer. A layer of silicon 32, subsequently becomes an SBPD, is disposed over dielectric layer 22. Silicon layer 32 includes a p-type portion 24, an n-type portion 26, and a center portion 28 disposed between p-type portion 24 and n-type portion 26. P-type portion 24 overlaps one of STIs 16 and n-type portion 26 overlaps the other one of STIs 16. Center portion 28 overlaps well region portion 14A. In one embodiment, center portion 28 of silicon layer 32 is doped with an n-type impurity having a doped concentration lower than that of n-type portion 26. In another embodiment, center portion 28 of silicon layer 32 is doped with a p-type impurity having a doped concentration lower than that of p-type portion 24. In addition, in an embodiment in which diffused region 20 is an n-type diffused region, diffused region 20 is adjacent one of STIs 16 and n-type portion 26 of silicon layer 32. A plurality of contacts 30 are formed inside diffused region 20, p-type portion 24 and n-type portion 26 of silicon layer 32.

In operation, SBPD 32 responds to ESD pulses to provide electrostatic discharge protection. Furthermore, well region 14 can be biased to control SBPD 32. In one embodiment, diffused region 20 is biased to cause well region 14 to be biased to control SBPD 32 for providing electrostatic discharge protection.

Figure 5:
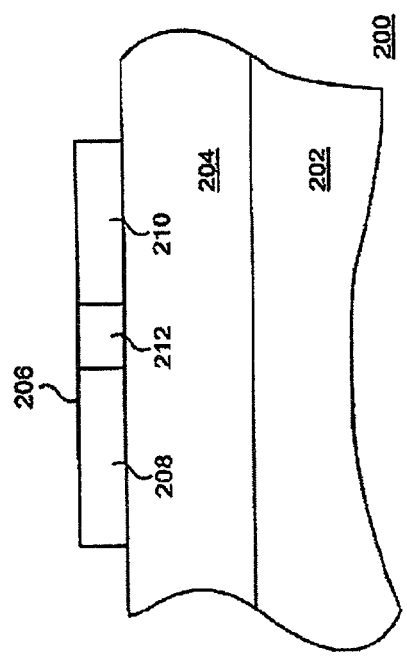
FIG. 5 shows a cross-sectional view of a silicon diode in accordance with another embodiment of the present invention.

FIG. 5 shows a cross-sectional view of a silicon diode in accordance with another embodiment of the present invention. Referring to FIG. 5, an integrated circuit 200 includes a semiconductor substrate 202 and a dielectric layer 204 formed over semiconductor substrate 202. Dielectric layer 204 may comprise a conventional STI. Integrated circuit 200 also includes a layer of silicon 206, subsequently becomes a silicon diode, is disposed over dielectric layer 204. Silicon layer 206 includes a p-type portion 208, an n-type portion 210, and a center portion 212 disposed between p-type portion 208 and n-type portion 210. In one embodiment, center portion 212 is undoped and may be fabricated in a salicide CMOS process. The silicon diode thus formed has no junction in semiconductor substrate 202, eliminating substrate noise coupling.

FIG. 6 shows a cross-sectional view of a base-biased silicon diode in accordance with another embodiment of the present invention. Referring to FIG. 6, the SBPD of the present invention is implemented in a silicon-on-insulator (SOI) CMOS integrated circuit 34. An insulator 38 is disposed over a semiconductor substrate 36. A silicon layer 40 is disposed over insulator layer 38 and includes an isolation structure 42 formed inside silicon layer 40 and an isolation structure 44 formed inside silicon layer 40 and spaced apart from isolation structure 42. Silicon layer 40 also includes a base portion 46 disposed between and contiguous with isolation structures 42 and 44. In one embodiment of the present invention, substrate 36 is a p-type substrate, and isolation structures 42 and 44 are STIs.

A dielectric layer (not shown) is disposed over silicon layer 40, and a layer of polysilicon 52 is disposed over the dielectric layer. Polysilicon layer 52 may also be a silicon layer. Polysilicon layer 52 includes a p-type portion 50, an n-type portion 48 and a center portion (not shown) disposed between and contiguous with the p-type and n-type portions 48 and 50. In addition, p-type portion 50 overlaps isolation structure 44 and n-type portion 48 overlaps isolation structure 42. The center portion of polysilicon layer 52 overlaps base portion 46. Integrated circuit 34 may additional comprise a diffused region (not shown) inside silicon layer 40 adjacent one of isolation structures 42 and 44. Integrated circuit 34 also comprises a plurality of contacts 54.

In operation, insulator layer 38 isolates devices in SOI integrated circuit 34. Thus, silicon diode 52 of the present invention is adapted to be base-biased. The bias supply for based-biased silicon diode 52 may be located on one or both sides of based-biased silicon diode 52 in the form of diffused region adjacent one of isolation structure 42 and 44. Base portion 46 of silicon layer 40 may also be biased to control based-biased silicon diode 52 to provide electrostatic discharge protection. Therefore, this embodiment of the present invention appropriately named a base-biased silicon diode. FIG. 7 is a layout diagram of base-biased silicon diode 52 as shown in FIG. 6 along the A-A' direction.

Figure 8F:
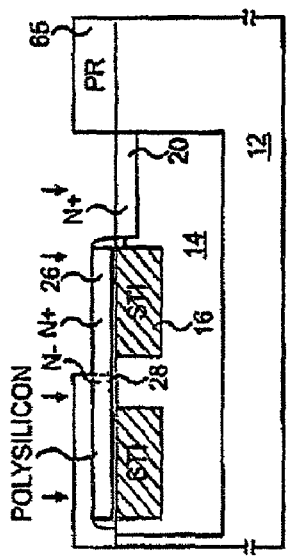

FIGS. 8A-8H are cross-sectional views of the steps in a method of forming a substrate-biased silicon diode of the present invention. Referring to FIG. 8A, a semiconductor substrate 12 is prepared and defined. In one embodiment, semiconductor substrate 12 is a p-type substrate. FIG. 8B shows the formation of STIs 16 inside semiconductor substrate 12. In general, STIs are formed by providing a mask over a substrate. After the mask is patterned and defined, the semiconductor substrate is etched to form shallow trenches spaced apart from one another. A dielectric material, such as silicon dioxide, silicon nitride or silicon oxynitride, is deposited to fill the trenches. The mask is then removed.

FIG. 8C shows an implantation of impurities to form a well region 14. Referring to FIG. 8C, after a photoresist 56 is patterned and defined, substrate 12 is doped with an impurity to form well 14. In one embodiment, substrate 12 is doped with an n-type impurity to form an n-well. After implantation, photoresist 56 is removed.

FIG. 8D shows the beginning of the formation of a silicon diode. Referring to FIG. 8D, a thin oxide layer 58 is grown over the surface of well region 14. A layer of silicon 32 is then deposited over oxide layer 58. A photoresist (not shown) is used to pattern and define silicon layer 32 during an etching process to form the structure shown in FIG. 8D. Conventional steps follow to form spacers 62 contiguous with silicon layer 32. Spacers 62 may be oxide spacers or nitride spacers.

Referring to FIG. 8E, a photoresist 64 is deposited over silicon layer 32, spacers 62, well 14, and substrate 12, and then patterned and defined to expose a first portion 26 of silicon layer 32, a portion of silicon layer 32 that would later become center portion 28, and a portion of well 14. A lightly-doped drain (LDD) of an impurity is implanted into first portion 26, center portion 28, and the exposed portion of well 14. The implanted impurity forms a diffused region 20 in well region 14. Therefore, first portion 26 contains the same type of impurity as center portion 28 and diffused region 20. In one embodiment, an LDD of an n-type impurity is implanted into first portion 26, center portion 28, and diffused portion 20.

Referring to FIG. 8F, a photoresist 65 is deposited over silicon layer 32, spacers 62, well 14, and substrate 12, and then patterned and defined to expose first portion 26 and diffused region 20. A high concentration of the same type of impurity implanted in FIG. 8E is implanted into first portion 26 and diffused region 20. The high concentration implant of FIG. 8F provides a higher concentration than the LDD implant of FIG. 8E. Diffused region 20 is implanted with the same type of impurity as first portion 26. After the high concentration implantation, diffused region 20 diffuses further into well 14, and first portion 26 now contains a higher concentration of impurity. Therefore, center portion 28 contains a lower concentration of impurities than first portion 26. Photoresist 65 is then removed. In one embodiment, a high concentration of an n-type impurity is implanted, and first portion 26 becomes the n-portion of an SBPD.

Figure 8G:
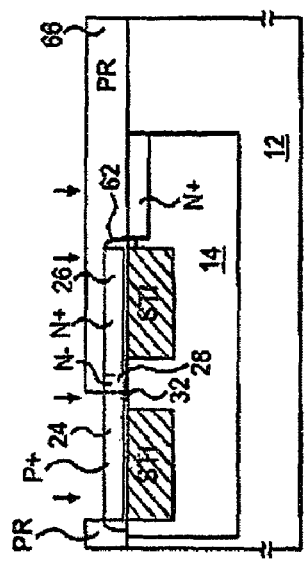
Figure 8H:
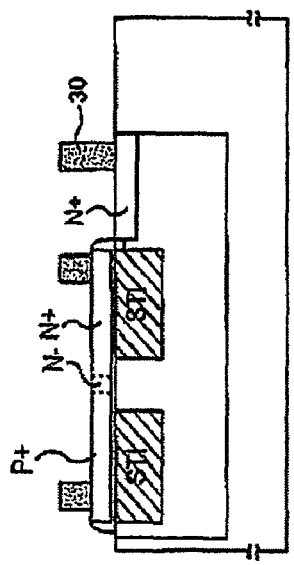

Referring to FIG. 8G, a photoresist 66 is deposited over silicon layer 32, spacers 62, well 14, and substrate 12. Photoresist 66 is patterned and defined to expose a second portion 24 of silicon layer 32. An impurity of a different type than the LDD and high concentration implants of FIGS. 8E and 8F is implanted into second portion 24. Second portion 24 is heavily doped with the different impurity. In one embodiment, second portion 24 is heavily doped with a p-type impurity and become the p-portion of an SBPD. Photoresist 66 is then removed. Referring to FIG. 8H, conventional semiconductor processing follows to form a plurality of contacts 30.

Figure 9F:
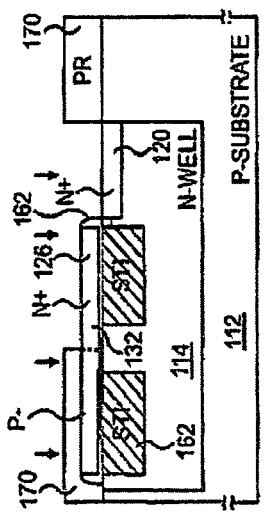

Similar to the method of forming an SBPD shown in FIGS. 8A-8H above, FIGS. 9A-9H are cross-sectional views of the steps in a method of forming a substrate-biased silicon diode with a p-type center region. Referring to FIG. 9A, a p-type semiconductor substrate 112 is prepared and defined. FIG. 9B shows the formation of STIs 116 inside semiconductor substrate 112. STIs 116 may be formed using the process steps described above. FIG. 9C shows an n-well implantation to form an n-well region. Referring to FIG. 9C, after a photoresisit 156 is patterned and defined, substrate 112 is doped with an n-type impurity to form n-well 114. In addition, STIs 116 are now disposed inside n-well 114. After implantation, photoresist 156 is removed.

Referring to FIG. 9D, a thin oxide layer 158 is grown over the surface of n-well 114. A layer of silicon 132 is then deposited over oxide layer 158. A photoresist (not shown) is used to pattern and define polysilicon layer 132 during etching to form the structure shown in FIG. 9D. Conventional steps follow to form spacers 162 contiguous with polysilicon layer 132. Spacers 162 may be oxide spacers or nitride spacers.

Referring to FIG. 9E, after a photoresist 168 is deposited over polysilicon layer 132, spacers 162, n-well 114, and substrate 112, photoresist 168 is patterned and defined to expose a second portion 124 of polysilicon layer 132. A p-type lightly-doped drain (LDD) is implanted into second portion 124. Photoresist 168 is removed after the implantation step.

Referring to FIG. 9F, a photoresist 170 is deposited over polysilicon layer 132, spacers 162, n-well 114, and substrate 112. Photoresist 170 is patterned and defined to expose a first portion of polysilicon layer 126, a portion of polysilicon layer 132 that would later become a center portion 128, and a portion of n-well 114. A high-concentration n-type impurity is implanted into first portion 126, center portion 128, and the portion of n-well 114. Implanted portion of n-well 114 becomes an n-type diffused region 120. Photoresist 170 is then removed.

Figure 9G:
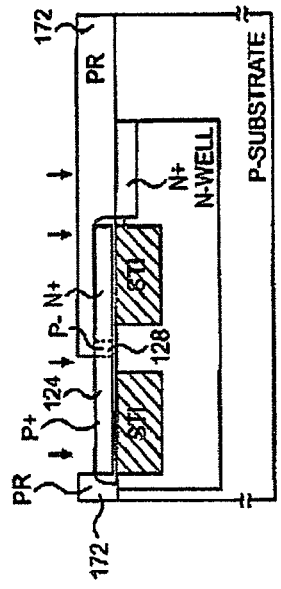
Figure 9H:
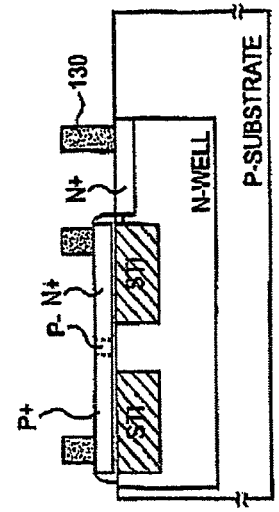

Referring to FIG. 9G, a photoresist 172 is laid down and patterned. Using photoresist 172 as a mask, a high concentration of a p-type impurity is implanted into second portion 124. The implantation concentration of the step shown in FIG. 9G is larger than that of the LDD implantation step shown in FIG. 9E. The p-portion 124 of an SBPD is formed and contains a higher impurity concentration than center region 128 of the SBPD. Photoresist 172 is then removed. Referring to FIG. 9H, conventional semiconductor processing follows to form a plurality of contacts 130.

For a silicon diode of the present invention manufactured using an SOI technology, a modification of the manufacturing processes described above will be required. However, the modification will be limited to the few steps at the beginning of the manufacturing process unrelated to the manufacturing steps for the formation of the silicon diode. With the exception of the steps related to the creating of a well region, the manufacturing steps described above follow to manufacture a base-biased silicon diode of the present invention as described above.

Figure 10:
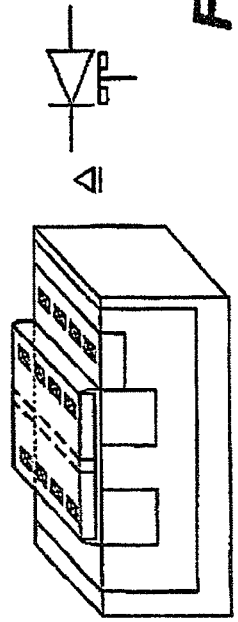
FIG. 10 shows the circuit symbol for the substrate-biased silicon diode of the present invention relative to the cross-sectional view of the diode.
Figure 11:
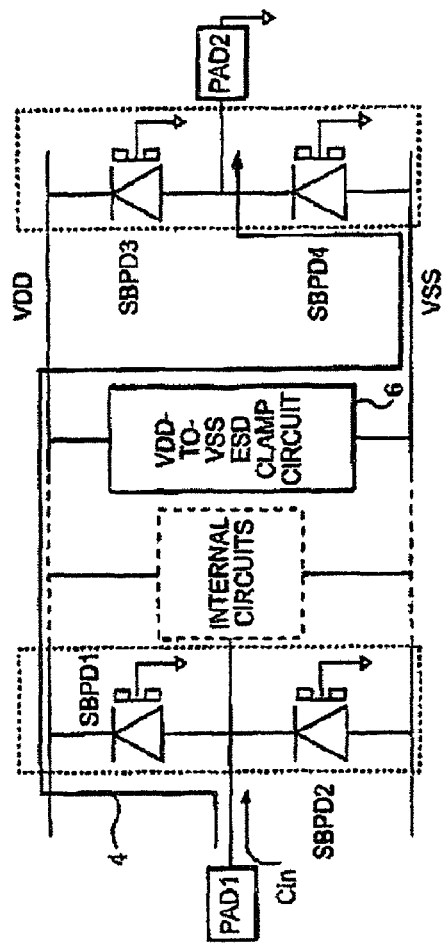
FIG. 11 is a circuit diagram of an ESD protection circuit with dual substrate-biased silicon diodes of the present invention.

FIG. 10 is a circuit symbol for an SBPD of the present invention relative to the cross-sectional view of the diode. FIG. 11 is a circuit diagram of an ESD protection circuit with two dual-SBPDs. The first dual SBPDs include SBPD1 and SBPD2, and second dual SBPDs include SBPD3 and SBPD4. Referring to FIG. 11, dual silicon diodes SBPD1 and SBPD2 are used in a forward-biased condition to discharge an ESD current so that the ESD current does not damage the internal circuits. When an ESD current 4 is applied to Pad1, and with Pad2 grounded relative to Pad1, an ESD current 4 is conducted to VDD through silicon diode SBPD1. ESD current 4 is then discharged to the VSS line through a VDD-to-VSS ESD clamp circuit 6 and flows out of the IC through SBPD4.

Therefore, the present invention also includes a method for protecting a CMOS semiconductor device from electrostatic discharge. The method provides a signal to the semiconductor device through a CMOS semiconductor circuit that includes at least one substrate-biased silicon diode to protect the semiconductor device from electrostatic discharge. Similarly, the present invention also includes a method for protecting a silicon-on-insulator semiconductor device from electrostatic discharge. The method provides a signal to the device through a silicon-on-insulator circuit that includes at least one base-biased silicon diode to protect the semiconductor device from electrostatic discharge.

Figure 1A:
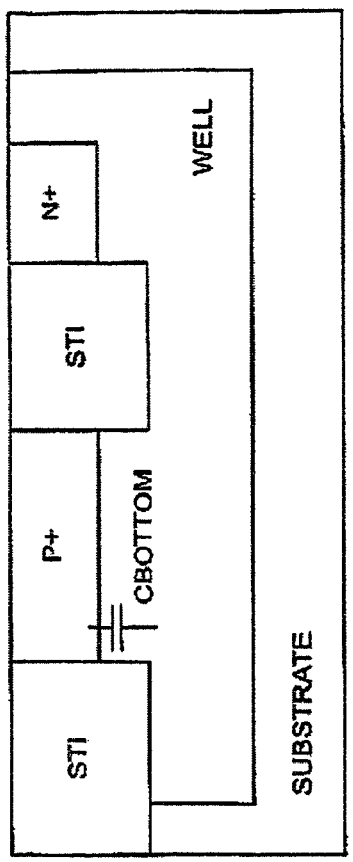
FIG. 1A shows a cross-sectional view of a known diode structure formed in an integrated circuit.
Figure 1B:
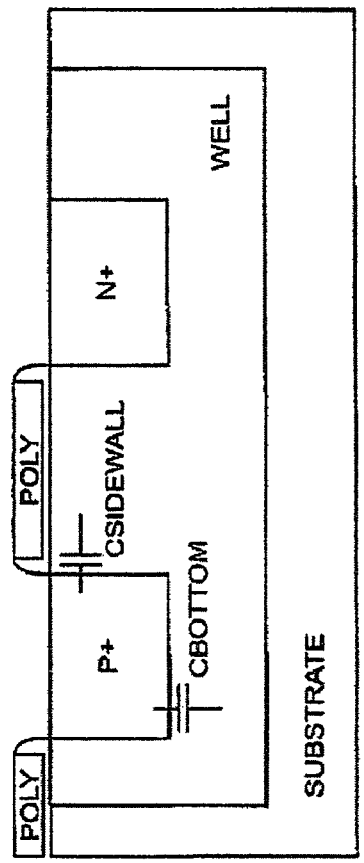
FIG. 1B shows a cross-sectional view of another known diode structure formed in an integrated circuit.
Figure 2:
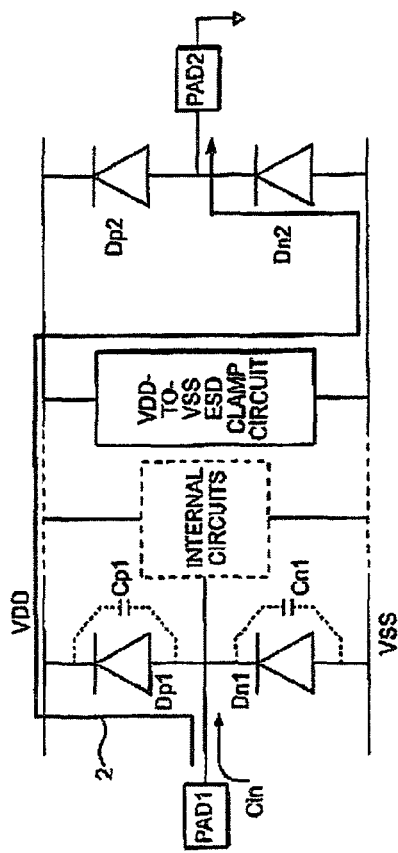
FIG. 2 is a circuit diagram of a known ESD protection circuit.
Figure 3:
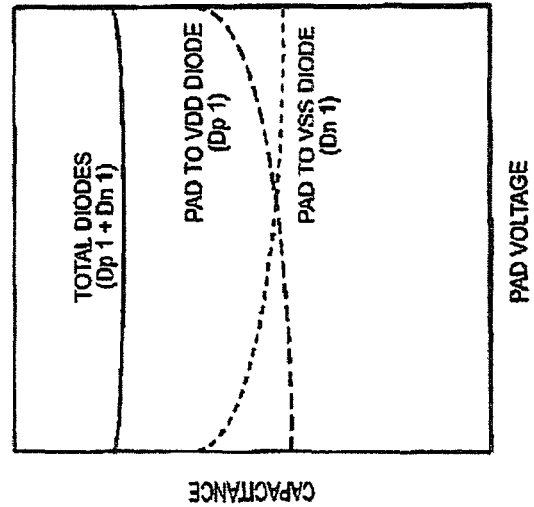
FIG. 3 is plot showing the relationship between a pad voltage and parasitic input capacitance of the circuit shown in FIG. 2.
Figure 12B:
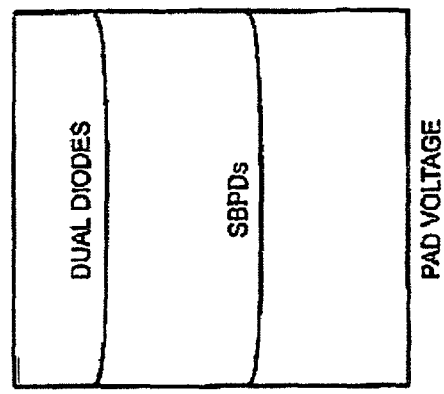
FIG. 12B is plot showing the relationship between a pad voltage and total parasitic input capacitance of the dual substrate-biased silicon diodes of FIG. 10.
Figure 12A:
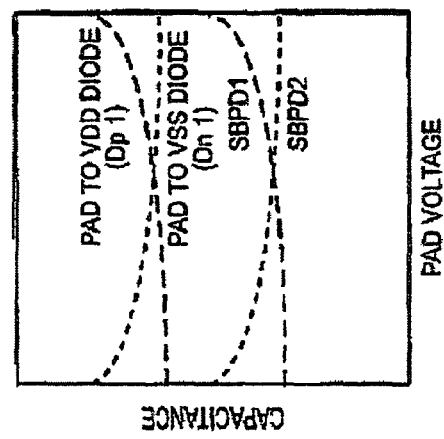
FIG. 12A is a plot showing the relationship between a pad voltage and individual parasitic input capacitance of the dual substrate-biased silicon diodes of FIG. 10.

FIG. 12A is a plot showing the relationship between a pad voltage and individual parasitic input capacitance of the dual substrate-biased silicon diodes of FIG. 11. When the n-well region of an SBPD is biased to ground, the parasitic capacitance of the SBPD is approximately half of the polysilicon-bound diode of FIG. 1B because, unlike a polysilicon-bound diode, an SBPD does not have a bottom junction capacitance, $C_{bottom}$. As shown in FIG. 12A, the capacitance variation of an SBPD relative to pad voltages is similar to that of a polysilicon-bound diode as shown in FIG. 3. Therefore, the total input capacitance $C_{in}$ of the dual SBPDs of FIG. 11 is also approximately half of the dual polysilicon-bound diodes. This relationship is shown in FIG. 12B.

The input parasitic capacitance of SBPDs may be further reduced by connecting a plurality of SBPDs in series because capacitances connected in series lower the total capacitance. FIG. 13A is a circuit diagram of one embodiment of an ESD protection circuit using dual SBPDs. Assuming each of the SBPDs has the same capacitance C, the total capacitance for FIG. 13A is 2C. FIG. 13B is a circuit diagram of one embodiment of an ESD protection circuit using two dual-SBPDs. The total capacitance for FIG. 13B is C. FIG. 13C is a circuit diagram of another embodiment of an ESD protection circuit using dual SBPD strings. The total capacitance for FIG. 13C is 2C/n, wherein n represents the number of SBPDs.

FIG. 14 is a circuit diagram of one embodiment of an ESD protection circuit with biased dual SBPDs of the present invention. Referring to FIG. 14, an integrated circuit device 74 receives signals from a signal pad 76. Device 74 includes a pair of SBPDs 78 and 80, responsive to the signals from signal pad 76 for providing electrostatic discharge protection from the signals. Each of SBPDs 78 and 80 includes a p-portion and an n-portion (not numbered) and signal pad 76 is coupled to the p-portion of one of the pair of SBPDs and the n-portion of the other one of the pair of SBPDs. In one embodiment of the invention as shown in FIG. 11, device 74 additionally comprises a second pair of SBPDs, SBPD3 and SBPD4, coupled to clamp circuit 6. In another embodiment as shown in FIG. 13C, each of the pair of SBPDs 78 and 80 of FIG. 14 includes a plurality of serially coupled SBPDs.

Referring again to FIG. 14, device 74 further comprises a detection circuit 86 for detecting signals from signal pad 76 and providing a bias voltage to SBPDs 78 and 80. In one embodiment, an integrated circuit that receives electrostatic charges from a signal pad comprises a plurality of serially coupled SBPDs responsive to the electrostatic pulses from the signal pad for providing electrostatic discharge protection from the signals. Detection circuit 78 comprises a resistor-capacitor (R-C) circuit having a delay constant longer than the duration of the electrostatic pulses. The resistor-capacitor circuit is coupled in parallel with a transistor network. The transistor network comprises a first transistor 84, and a second transistor 82, and each of the transistors includes a gate, source and drain. The gate of first transistor 84 is coupled to the gate of second transistor 82 and the resistor-capacitor circuit. In addition, the drain of first transistor 84 and the drain of the second transistor 82 are coupled to a substrate of SBPDs 78 and 80. The source of first transistor 84 is coupled to a VDD signal and the source of second transistor 82 is coupled to a VSS signal. In operation, the drain of first transistor 84 and the drain of the second transistor 82 are coupled to the substrate of SBPDs 78 and 80 to provide a bias voltage.

The substrate-biased polysilicon diode (SBPD) structure previously described may also be used for optical detection as well as for ESD protection. In particular, the SBPD structure having an intrinsic or undoped region may serve as a photodiode for detecting impinging radiation. A photodiode refers to a device capable of absorbing photons from an incident light and converting the absorbed photons into a current flow. Once the photodiode is electrically activated by an incident light, a depletion region is formed at the junction of a p-type layer and an n-type layer and acts as a capacitor. When radiation such as light is directed upon an active area of the photodiode, photons absorbed in the depletion region generate electron-hole pairs which create a current flow.

Photodiodes are generally arranged in an array of rows and columns in an image sensor, which is manufactured in complementary metal-oxide-semiconductor ("CMOS") processes, hereinafter the CMOS image sensor. An important characteristic of the CMOS image sensor is its sensitivity, which is defined as sum of a dark current plus a photo current as given below.

$$I_{TOTAL} = I_{DARK} + I_{PHOTO}$$

where $I_{TOTAL}$ represents the sensitivity, $I_{DARK}$ refers to a dark current or leakage current which should have not occurred in the absence of an incident light, and $I_{PHOTO}$ refers to a current flow created by absorbed photons.

To enhance the sensitivity of a CMOS image sensor, on one hand, is to increase the photo current term, $I_{PHOTO}$. Examples of image sensor or photodiode structures for increasing the photo current can be found in U.S. Pat. No. 5,982,011 to Kalnitsky et al., entitled "Photodiode Structure Augmented with Active Area Photosensitive Regions" ("the '011 patent"), U.S. Pat. No. 6,040,592 to McDaniel et al., entitled "Well to Substrate Photodiode for use in a CMOS sensor on a Salicide Process" ("the '592 patent"), and U.S. Pat. No. 6,723,580 to Park, entitled "Method of Forming a Photodiode for an Image Sensor" (the '580 patent.) The '011 patent enhances quantum efficiency by increasing photon absorption in depletion regions at the cost of additional masks. Moreover, an incident light must transmit through field oxide regions or diffused regions before it reaches a depletion region, disadvantageously resulting in a decrease of photons absorbed. The '592 patent enhances quantum efficiency by increasing depletion regions without changing any manufacturing processes. A disadvantage of the '592 patent, however, is that an incident light must transmit through shallow trench isolation ("STI") structures or well regions before it reaches a depletion region. The '580 patent enhances quantum efficiency by increasing the area of an active surface for absorbing photons. However, additional processes are required to form trenches in odd shape in order to increase an active surface.

Figure 15:
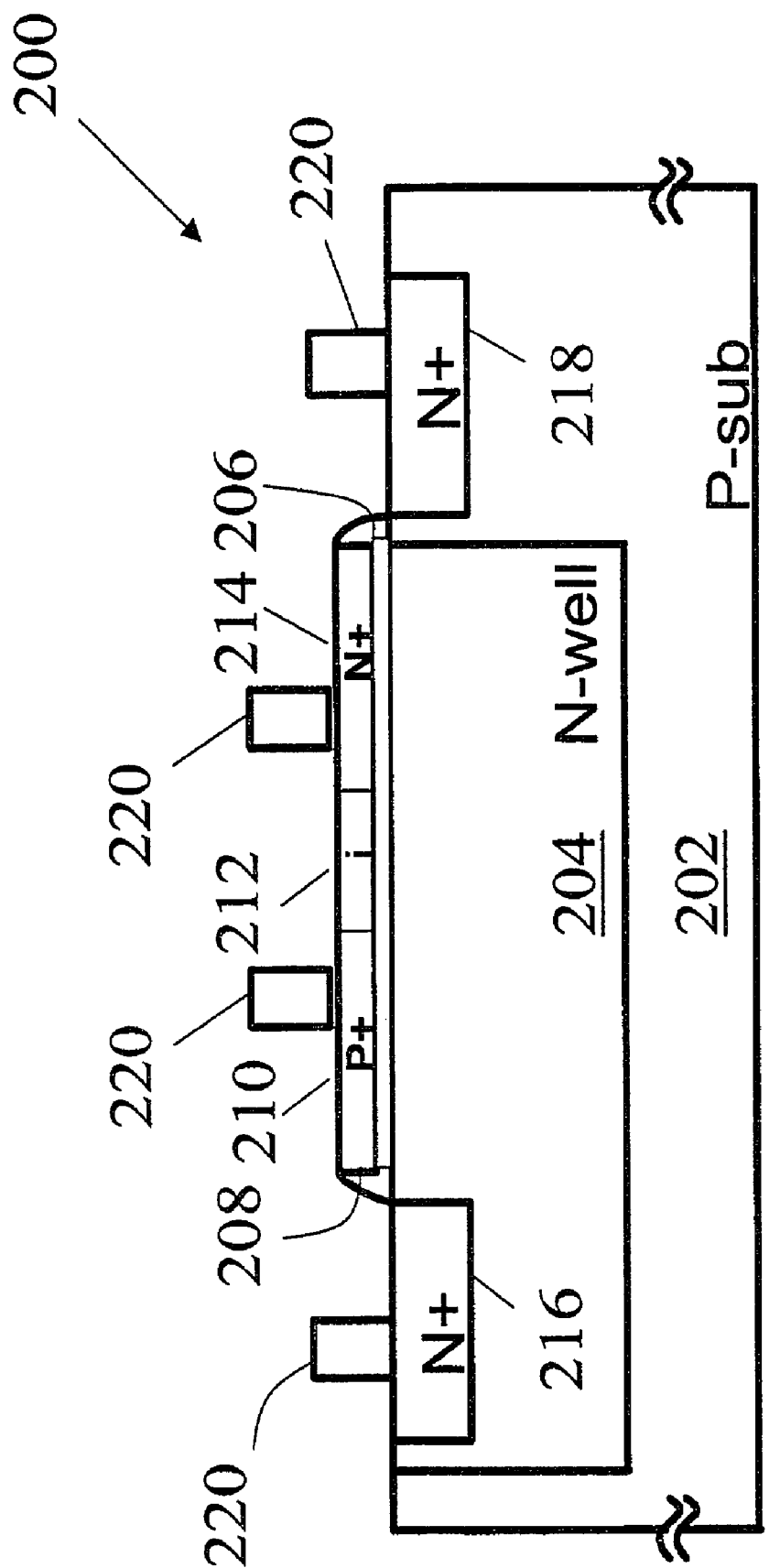
FIG. 15 is a cross-sectional view of a substrate-biased photodiode structure in accordance with one embodiment of the present invention.

On the other hand, the sensitivity of a CMOS image sensor can be improved by decreasing the dark current term $I_{DARK}$ by using the SBPD structure having an intrinsic region. FIG. 15 is a cross-sectional view of a substrate-biased photodiode structure 200 in accordance with one embodiment of the present invention. Referring to FIG. 15, substrate-biased photodiode structure 200 includes a substrate 202, a well region 204 formed inside substrate 202, a dielectric layer 206 formed over well region 204, and a layer of polysilicon 208 formed over dielectric layer 206 to serve as a photodiode for receiving an incident optical signal. Polysilicon layer 208 includes a p-type portion 210, an n-type portion 214, and an intrinsic or undoped portion 212 disposed between p-type portion 210 and n-type portion 214. Photodiode structure 200 also includes a first diffused region 216 formed inside well region 204 and a second diffused region 218 formed outside well region 204. Contacts 220 are formed over polysilicon layer 208, first diffused region 216 and second diffused region 218.

In operation, well region 204 is biased to control polysilicon layer 208 for converting the incident optical signal into an electrical signal. In another aspect, first diffused region 216 is biased to cause well region 204 to be biased to control polysilicon layer 208. Specifically, the bias controls the width of depletion regions at interfaces between p-type portion 210 and intrinsic portion 212 and between n-type portion 214 and intrinsic portion 212.

The present invention provides a planar or horizontal P-I-N structure including p-type portion 210, intrinsic portion 212 and n-type portion 214 disposed on a same surface, which is distinctive from a vertical structure disclosed in the '011, '592 and '580 patents where a P-N structure is formed top to bottom. Moreover, unlike the vertical structure in which an incident light must travel through well regions or diffused regions before it reaches a depletion region, in the horizontal structure according to the present invention, an incident light can directly and uniformly impinges upon polysilicon layer 208 without being filtered by well or diffused regions.

Figure 16A:
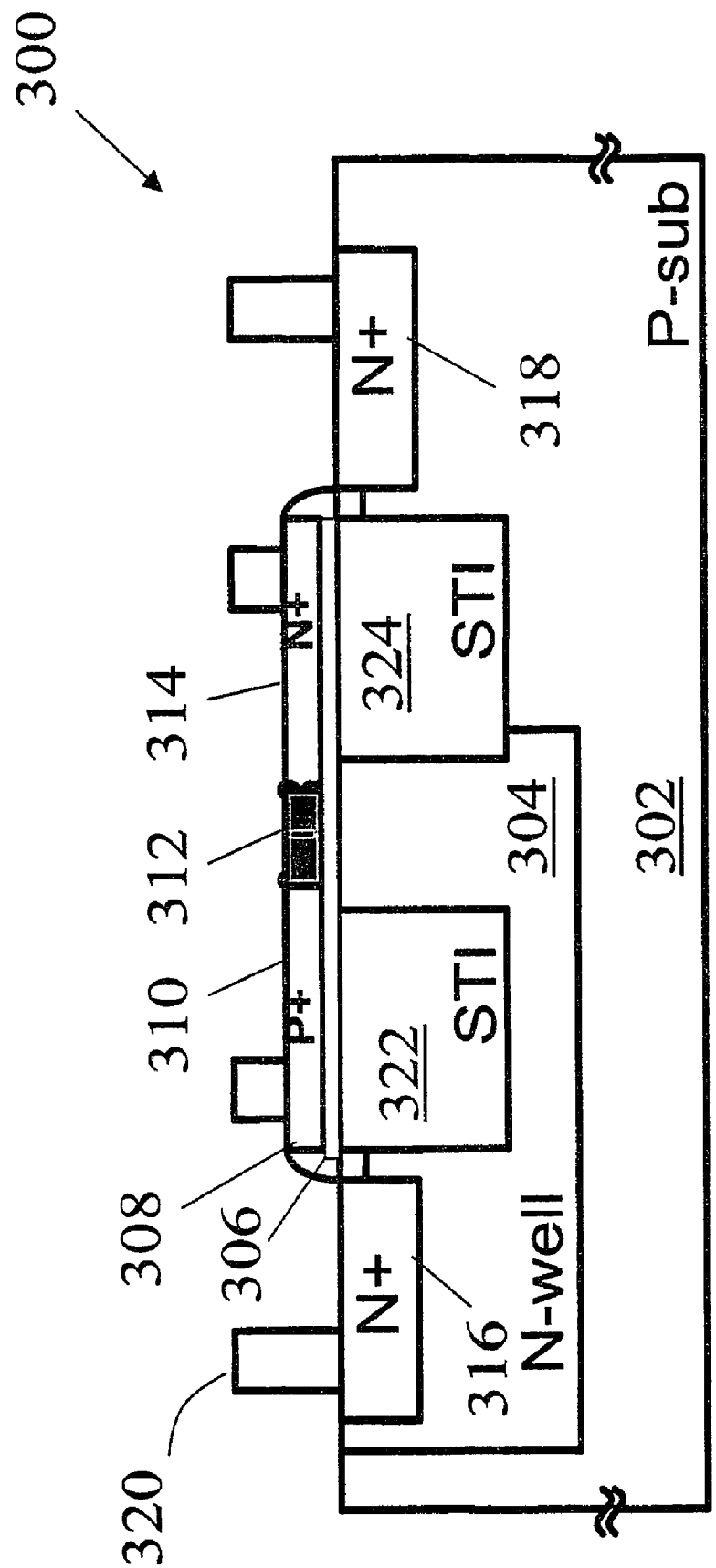
FIG. 16A is a cross-sectional view of a substrate-biased photodiode structure in accordance with another embodiment of the present invention.

FIG. 16A is a cross-sectional view of a substrate-biased photodiode structure 300 in accordance with another embodiment of the present invention. Referring to FIG. 16A, photodiode structure 300 includes a substrate 302, a well region 304, a dielectric layer 306, and a layer of polysilicon 308. Polysilicon layer 308 includes a p-type portion 310, an n-type portion 314, and an intrinsic or intrinsic portion 312 disposed between p-type portion 310 and n-type portion 314. A first diffused region 316 and a second diffused region 318 are respectively formed inside and outside well region 304. Contacts 320 are formed over polysilicon layer 308, first diffused region 316 and second diffused region 318. Photodiode structure 300 is similar to photodiode structure 200 shown in FIG. 15 except that photodiode structure 300 further includes a first isolation structure 322 and a second isolation structure 324 spaced apart from first isolation structure 322. In one embodiment according to the invention, first and second isolation structures 322 and 324 include shallow trench isolation ("STI") structures. Second isolation structure 324 overlaps a portion of well region 304. In another embodiment, second isolation structure 324 as well as first isolation structure 322 are disposed inside well region 304. In still another embodiment, intrinsic portion 312 overlaps a portion of well region 304 between first and second isolation structures 322 and 324.

Figure 16B:
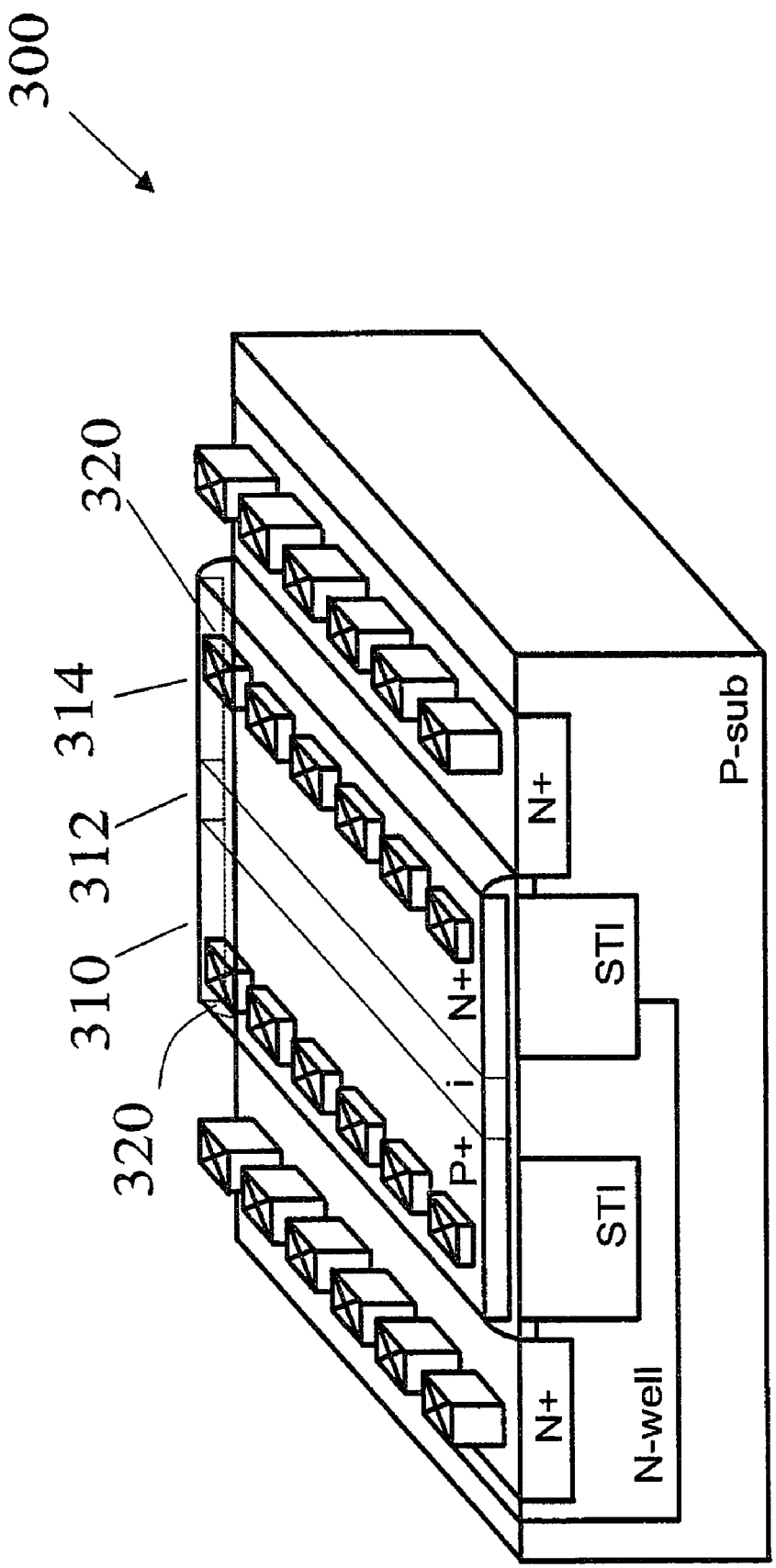
FIG. 16B is a perspective view of the substrate-biased photodiode structure shown in FIG. 16A.

FIG. 16B is a perspective view of substrate-biased photodiode structure 300 shown in FIG. 16A. Referring to FIG. 16B, p-type portion 310 is contiguous with intrinsic portion 312, which is in turn contiguous with n-type portion 314. A plurality of contacts 320 are formed over p-type portion 310 and n-type portion 314.

Figure 17:
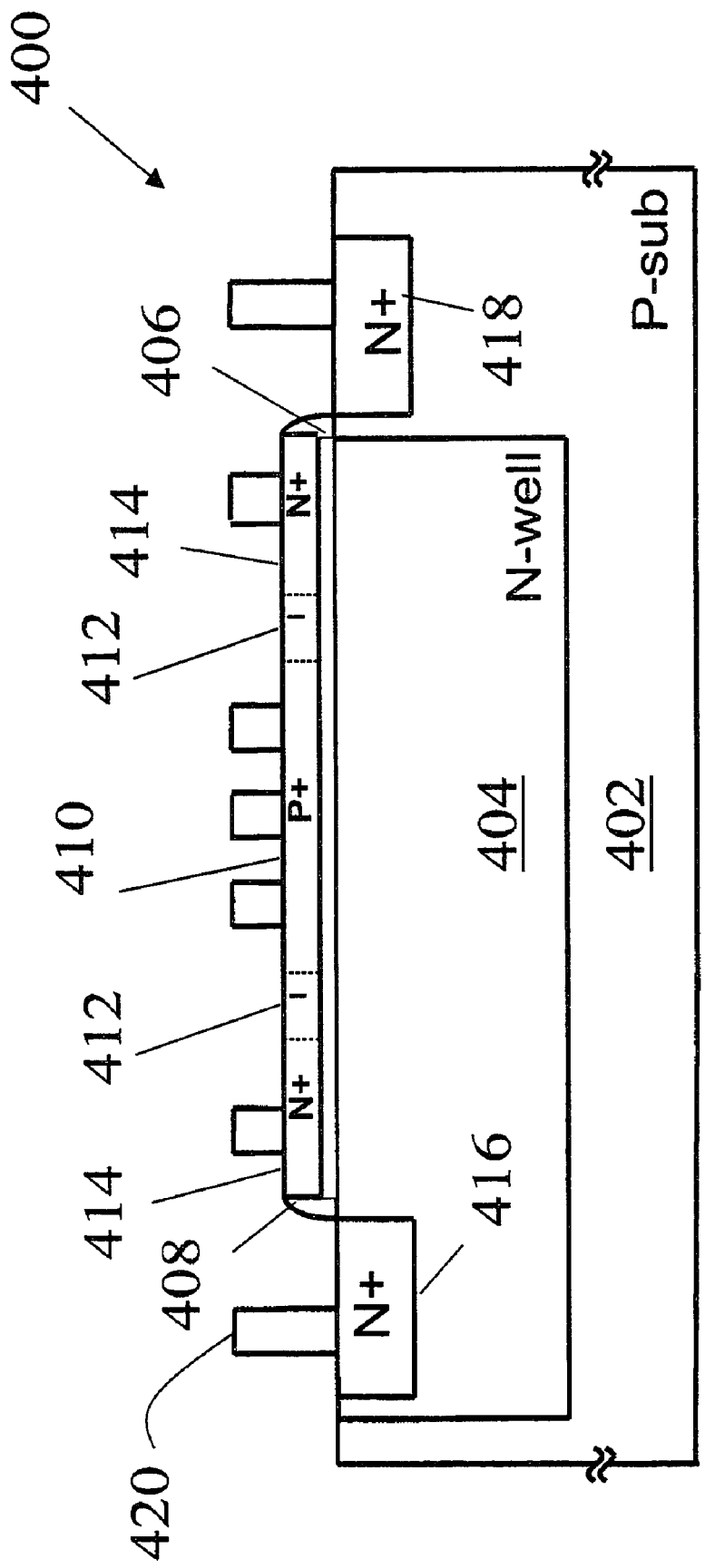
FIG. 17 is a cross-sectional view of a substrate-biased photodiode structure in accordance with one embodiment of the present invention.

FIG. 17 is a cross-sectional view of a substrate-biased photodiode structure 400 in accordance with one embodiment of the present invention. Referring to FIG. 17, substrate-biased photodiode structure 400 includes a substrate 402, a well region 404 formed inside substrate 402, a dielectric layer 406 formed over well region 404, and a layer of polysilicon 408 formed over dielectric layer 406 to serve as a photodiode. Polysilicon layer 408 includes a p-type portion 410, an n-type portion 414, and an intrinsic or intrinsic portion 412 disposed between p-type portion 410 and n-type portion 414. In the present embodiment, p-type portion 410 is surrounded by intrinsic portion 412, which is in turn surrounded by n-type portion 414. Photodiode structure 400 also includes a first diffused region 416 formed inside well region 404 and a second diffused region 418 formed outside well region 404. Contacts 420 are formed over polysilicon layer 408, first diffused region 416 and second diffused region 418.

Figure 18A:
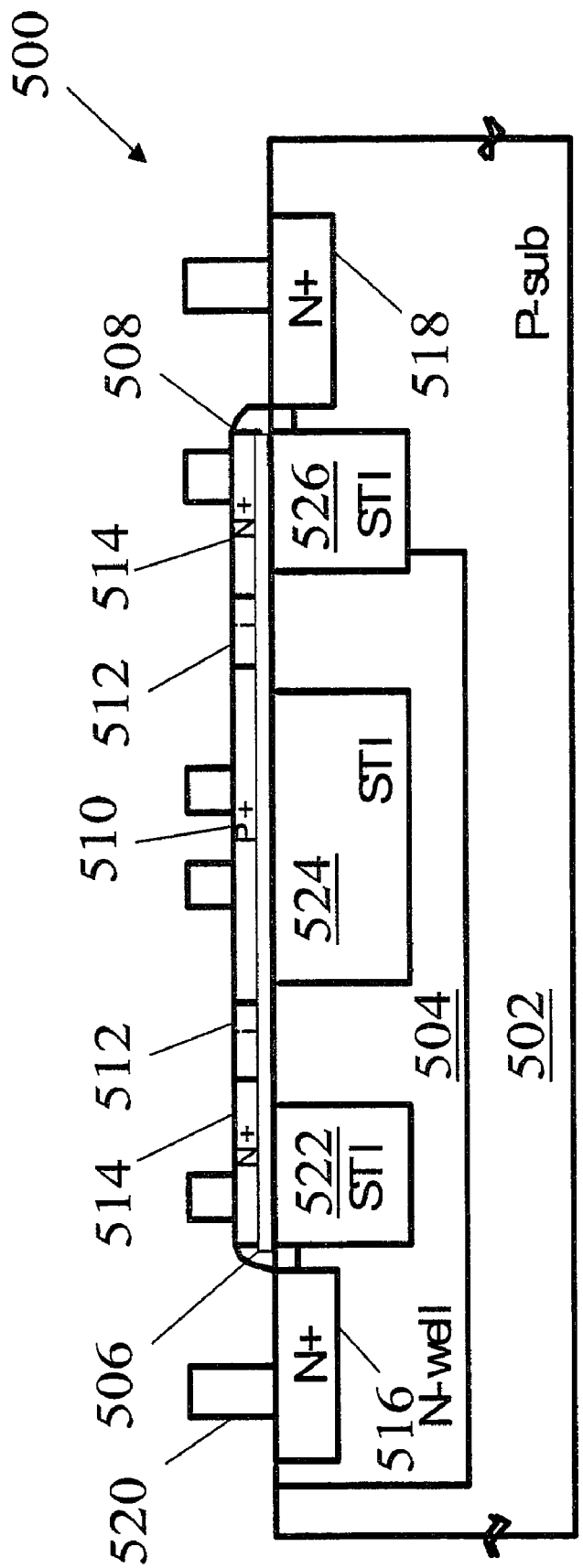
FIG. 18A is a cross-sectional view of a substrate-biased photodiode structure in accordance with another embodiment of the present invention.

FIG. 18A is a cross-sectional view of a substrate-biased photodiode structure 500 in accordance with another embodiment of the present invention. Referring to FIG. 18A, photodiode structure 500 includes a substrate 502, a well region 504, a dielectric layer 506, and a layer of polysilicon 508. Polysilicon layer 508 includes a p-type portion 510, an n-type portion 514, and an intrinsic or intrinsic portion 512 disposed between p-type portion 510 and n-type portion 514. P-type portion 510 is surrounded by intrinsic portion 512, which is in turn surrounded by n-type portion 514. A first diffused region 516 and a second diffused region 518 are respectively formed inside and outside well region 504. Contacts 520 are formed over polysilicon layer 508, first diffused region 516 and second diffused region 518. Photodiode structure 500 is similar to photodiode structure 400 shown in FIG. 17 except that photodiode structure 500 further includes a first isolation structure 522, a second isolation structure 524 and a third isolation structure 526 spaced apart from each other. Third isolation structure 526 overlaps a portion of well region 504. In another embodiment, third isolation structure 526 as well as first isolation structure 522 and second isolation structure 524 are disposed inside well region 504.

Figure 18B:
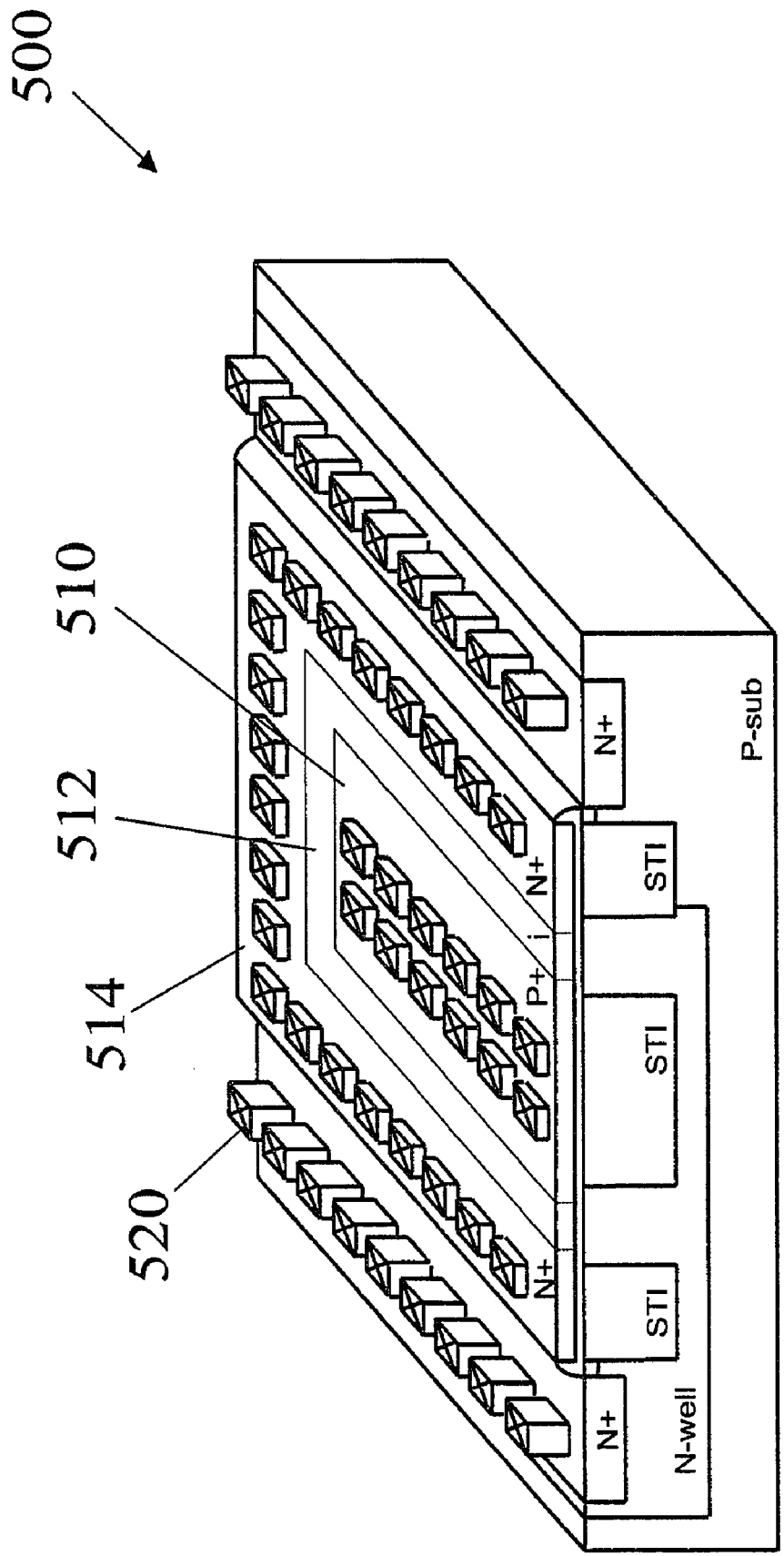
FIG. 18B is a perspective view of the substrate-biased photodiode structure shown in FIG. 18A.

FIG. 18B is a perspective view of substrate-biased photodiode structure 500 shown in FIG. 18A. Referring to FIG. 18B, p-type portion 510 is contiguous with intrinsic portion 512, which is in turn contiguous with n-type portion 514. Each of P-type portion 510, intrinsic portion 512 and n-type portion 514 has a ring shape. P-type portion 510 is surrounded by intrinsic portion 512, which is in turn surrounded by n-type portion 514. A plurality of contacts 520 are formed over p-type portion 510 and n-type portion 514.

Figure 19A:
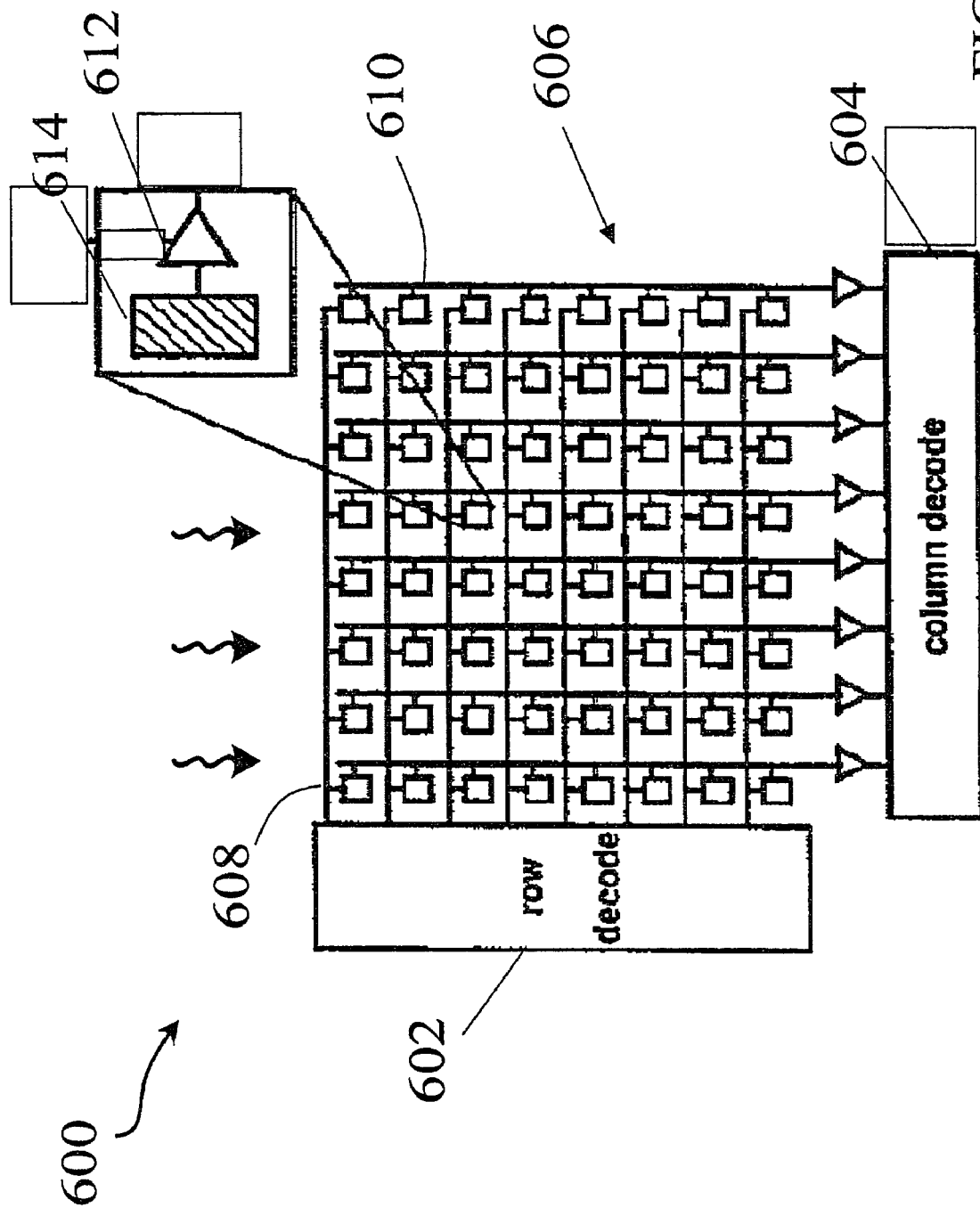
FIG. 19A is a schematic diagram of an image sensor in accordance with one embodiment of the present invention.

FIG. 19A is a schematic diagram of an image sensor 600 in accordance with one embodiment of the present invention. Referring to FIG. 19A, image sensor 600 includes a row decoder 602, a column decoder 604 and an array of photocells 606 formed in rows and columns. Row decoder 602, coupled to the array of photocells 606 through a plurality of row connection lines 608, generates a row select signal for a row of the array of photocells 606. Column decoder 604, coupled to the array of photocells 606 through a plurality of column connection lines 610, decodes a column of the array of photocells 606. The array of photocells 606 convert an incident optical signal, for example, an incident light, into an electrical signal. Each of photocells 606, disposed near an intersection of one of row connection lines 608 and one of column connection lines 610, includes a photodiode 612 and at least one active device 614. Photodiode 612 has a similar structure to those having been previously discussed by reference to FIGS. 15, 16A, 16B, 17, 18A and 18B, and is not described in detail. In particular, photodiode 612 includes a layer of polysilicon including a p-type portion, an n-type portion and an intrinsic portion disposed between the p-type portion and n-type portion.

Figures 19B, 19C:
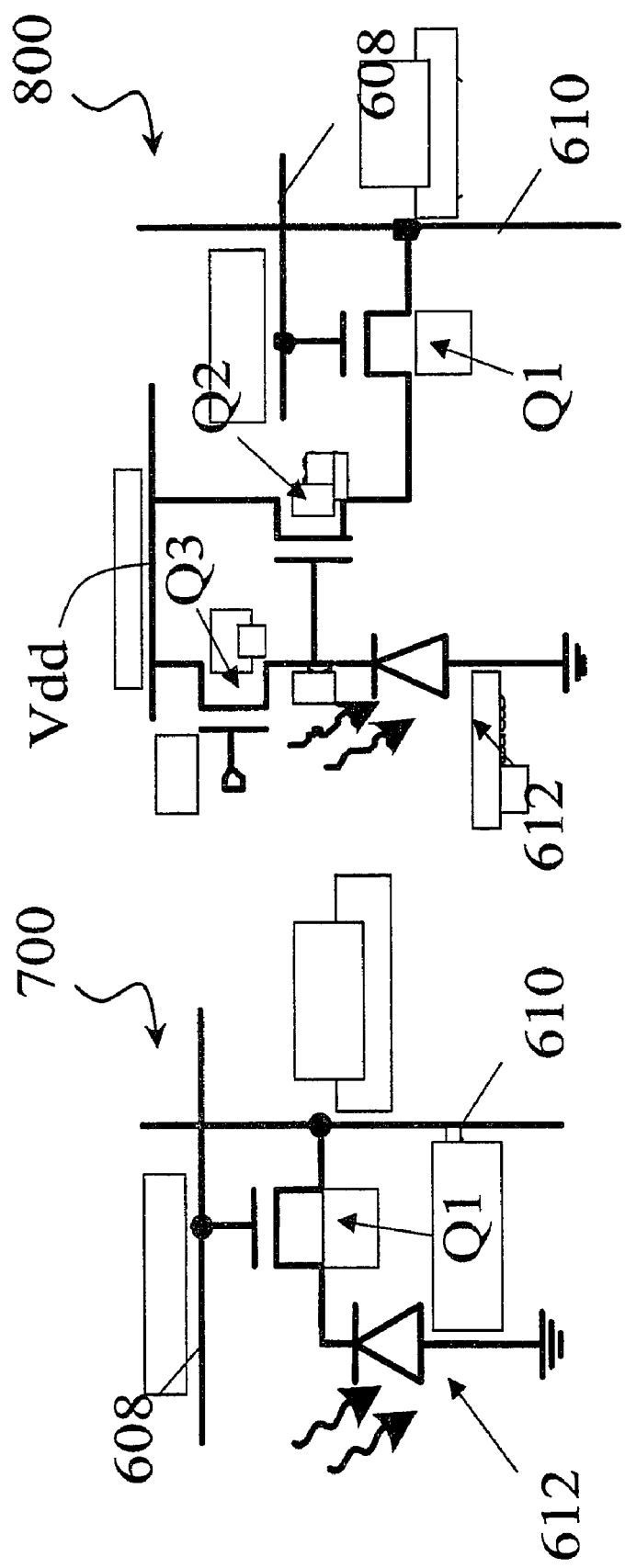
FIG. 19B is a circuit diagram of a photocell in accordance with one embodiment of the present invention.
FIG. 19C is a circuit diagram of a photocell in accordance with another embodiment of the present invention.

FIG. 19B is a circuit diagram of a photocell 700 in accordance with one embodiment of the present invention. Referring to FIG. 19B, photocell 700 includes photodiode 612 and an access transistor Q1. Access transistor Q1 includes a gate (not numbered) coupled to one of row connection lines 608 to receive a row select signal, a source (not numbered) coupled to one of column connection lines 610, and a drain (not numbered) coupled to an anode (not numbered) of photodiode 612. In operation, when access transistor Q1 is selected and an optical signal is incident upon photodiode 612, photodiode 612 converts the incident optical signal into an electric current, which flows through the column connection line 610 to column decoder 604.

FIG. 19C is a circuit diagram of a photocell 800 in accordance with another embodiment of the present invention. Referring to FIG. 19C, photocell 800 includes photodiode 612, a reset transistor Q3, an amplifier transistor Q2 and access transistor Q1. Reset transistor Q3 includes a gate (not numbered) for receiving a reset signal, a drain (not numbered) coupled to Vdd, and a source (not numbered) coupled to an anode (not numbered) of photodiode 612. Amplifier transistor Q2 includes a gate (not numbered) coupled to the anode of photodiode 612, a drain (not numbered) coupled to Vdd, and a source (not numbered) coupled to the drain of access transistor Q1. Reset transistor Q3 resets photodiode 612, and access transistor Q1 connects photocell 800 to column connection line 610.

Figure 20:
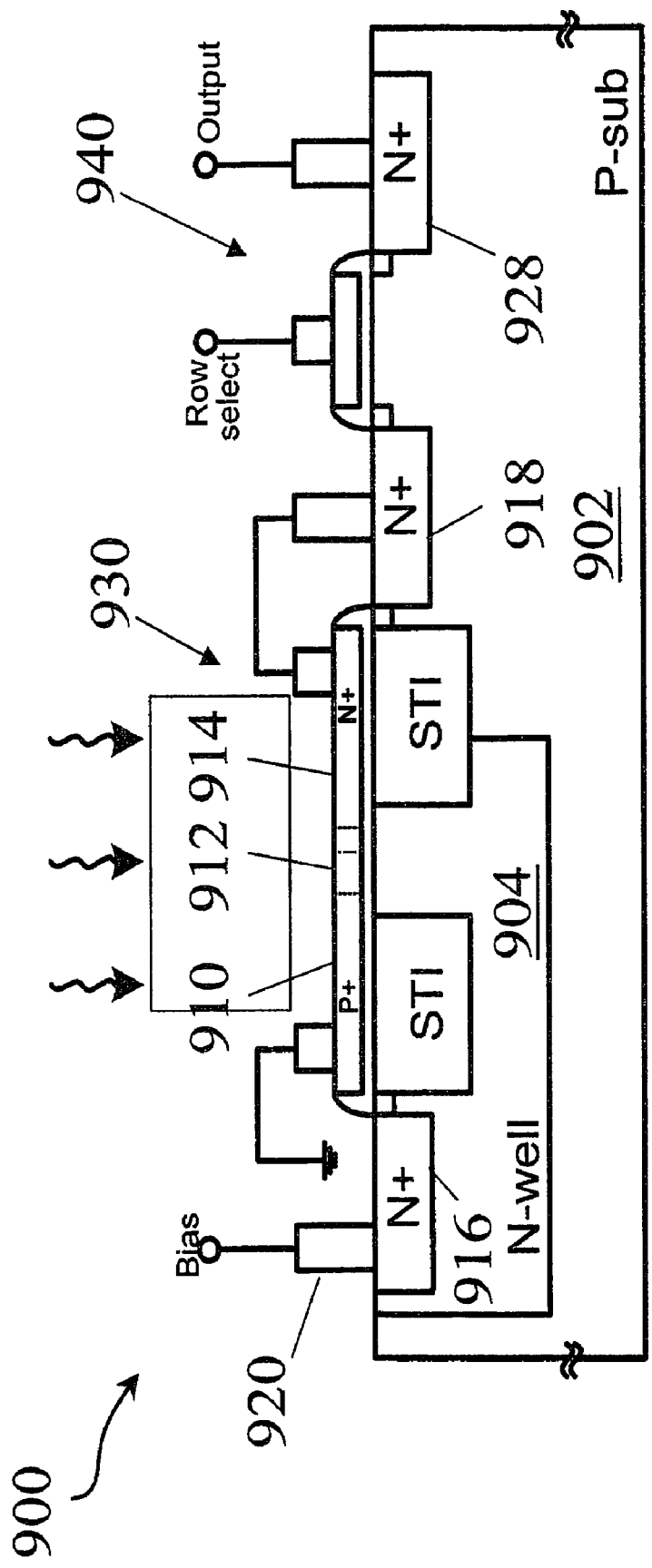
FIG. 20 is a cross-sectional view of a photocell in accordance with one embodiment of the present invention.

FIG. 20 is a cross-sectional view of a photocell 900 in accordance with one embodiment of the present invention. Referring to FIG. 20, photocell 900 includes a photodiode structure 930 similar to photodiode structure 300 shown in FIG. 16A, and a transistor 940. Transistor 940 includes a gate (not numbered) for receiving a row select signal, a drain 918 coupled to n-type portion 914 of photodiode structure 930, and a source 928 coupled to an output bus. P-type portion 910 of photodiode structure 930 is connected to a reference level. In operation, photodiode structure 930 converts an incident optical signal into a current flow from p-type portion 910 to n-type portion 914, and to transistor 940 for output. A bias is applied through contact 920 to first diffused region 916, which in turn causes well region 904 to be biased to control the volume of the current flow. The bias biases well region 904 to change the electron/hole distribution relationship and an electrical field in well region 904, thereby influencing the current flow. Bias, usually positive, is not greater than VDD, usually positive. If photodiode current is too small, the bias is used to influence the electrical field of photodiode structure 930 to increase the current flow.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for forming a complementary metal-oxide-semiconductor device, the method comprising:
    forming a well region inside a semiconductor substrate;
    forming a dielectric layer over the well region;
    forming a layer of polysilicon over the dielectric layer, the layer of polysilicon including a p-type portion, an n-type portion and an intrinsic portion disposed between the p-type and n-type portions and;
    forming, inside the semiconductor substrate, a diffused region outside the well region, wherein the formed semiconductor device is configured to convert an optical signal received at the layer of polysilicon to an electrical signal.

2. The method of claim 1, further comprising forming a first isolation structure and a second isolation structure spaced apart from the first isolation structure inside the semiconductor substrate.

3. The method of claim 1, further comprising forming a diffused region inside the well region.

4. The method of claim 3, wherein the semiconductor device is formed such that biasing the diffused region causes the well region to be biased for controlling the layer of polysilicon.

5. The method of claim 1, wherein the well region of the semiconductor device is configured to be biased to control the width of a depletion region between the p-type portion and the intrinsic portion.

6. The method of claim 1, wherein the well region is configured to be biased to control the width of a depletion region between the n-type portion and the intrinsic portion.

7. The method of claim 1, wherein the semiconductor device is formed such that the diffused region is coupled to one of the p-type or n-type portion while the other of the p-type or n-type portion is coupled to a reference level.

8. The method of claim 1, wherein the formed semiconductor device is configured such that biasing the well region permits control of the layer of polysilicon for converting the optical signal received at the layer of polysilicon to the electrical signal.

9. The method of claim 1, wherein the p-type portion is contacted on only one side by the intrinsic portion.

* * * * *

UNITED STATES PATENT AND TRADEMARK OFFICE
CERTIFICATE OF CORRECTION

PATENT NO. : 7,993,956 B2  
APPLICATION NO. : 11/618685  
DATED : August 9, 2011  
INVENTOR(S) : Shiu et al.

Page 1 of 1

It is certified that error appears in the above-identified patent and that said Letters Patent is hereby corrected as shown below:

Page 2, item (56), under "Other Publications", in Column 1, Line 17, delete "Substate" and insert -- Substrate --.

Column 14, line 19, in Claim 1, delete "portions and;" and insert -- portions; and --.

Signed and Sealed this

Seventh Day of February, 2012

David J. Kappos
*Director of the United States Patent and Trademark Office*